United States Patent [19]

Komatsu

[11] 4,210,689
[45] Jul. 1, 1980

[54] METHOD OF PRODUCING SEMICONDUCTOR DEVICES

[75] Inventor: Shigeru Komatsu, Yokohama, Japan

[73] Assignee: Tokyo Shibaura Denki Kabushiki Kaisha, Japan

[21] Appl. No.: 969,007

[22] Filed: Dec. 13, 1978

[30] Foreign Application Priority Data

Dec. 26, 1977 [JP] Japan .............................. 52-156812
Dec. 26, 1977 [JP] Japan .............................. 52-156813

[51] Int. Cl.² ........................................... H01L 21/38
[52] U.S. Cl. .................................... 427/88; 148/187;
148/1.5; 156/628; 156/644; 156/653;
156/659.1; 427/93; 427/94
[58] Field of Search .................. 148/1.5, 187; 427/93,
427/94, 88; 156/628, 644, 653, 659

[56] References Cited

U.S. PATENT DOCUMENTS 4,110,125  8/1978  Beyer ..................................... 427/93
4,131,497 12/1978  Feng et al. ........................... 148/1.5

OTHER PUBLICATIONS

Cuomo et al., "Growth of a Self-Aligned Gate FET Structure by Selective Refractory Metal Deposition" IBM TDB., vol. 14, No. 5, Oct. 1971 (427–494).

Primary Examiner—John D. Smith
Attorney, Agent, or Firm—Finnegan, Henderson, Farabow, Garrett & Dunner

[57] ABSTRACT

Semiconductor devices are produced by forming a first insulation film of a relatively high density on a semiconductor substrate having a first semiconductor region formed therein in advance, said first insulation film covering said first semiconductor region, and forming a second insulation film of a relatively low density on the first insulation film. The second insulation film is provided with at least one hole, and the second insulation film is densified to a level substantially equal to that of the first insulation film. Then the exposed portion of the first insulation film is provided with at least one opening with a nitride film used as a mask, and an impurity is diffused through the opening into the first semiconductor region to form therein a second semiconductor region.

13 Claims, 18 Drawing Figures

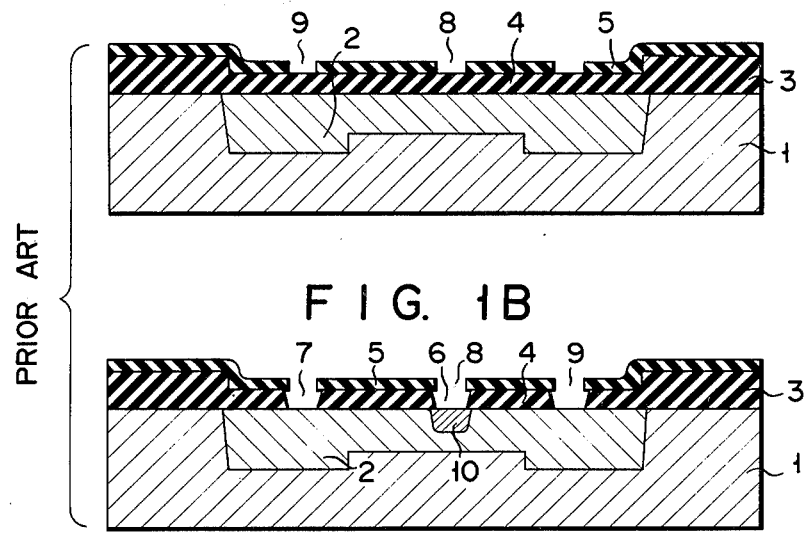
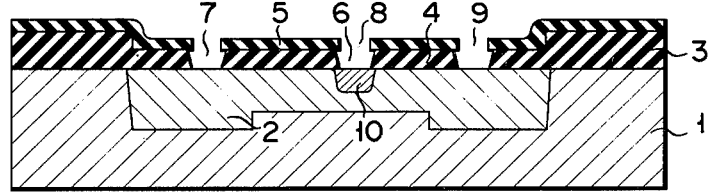
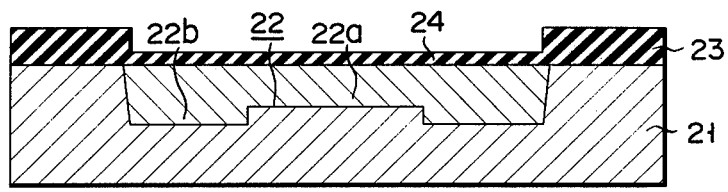
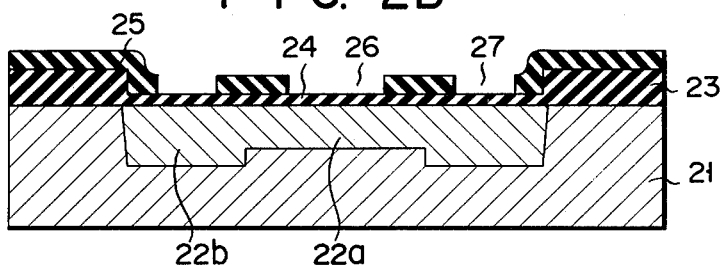

F I G. 3G
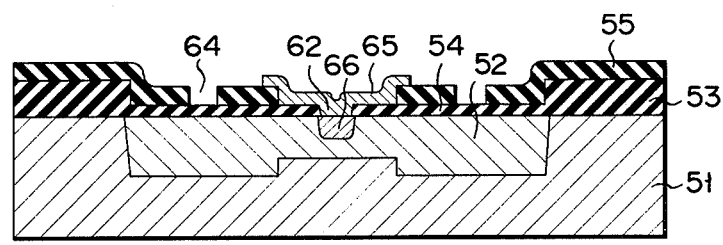
F I G. 3H
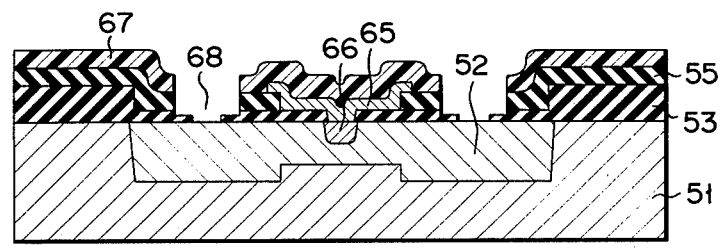
F I G. 3I
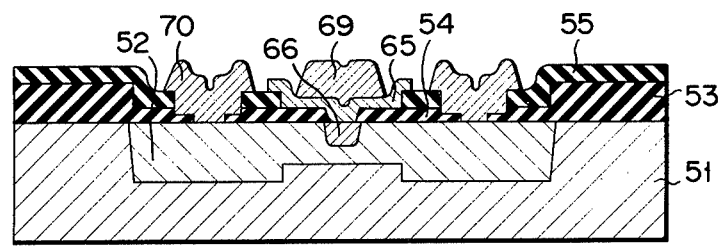

METHOD OF PRODUCING SEMICONDUCTOR DEVICES

This invention relates to a method of producing semiconductor devices, and more particularly to a method utilizing a novel self-aligning technique.

Recently, it is of high importance to form shallow PN junctions and to provide semiconductor elements of small dimensions in view of increasing demands for transistors usable in high frequency regions and for integrated circuit devices performing rapid operations.

It is known to the art to employ self-aligning techniques for producing semiconductor elements of small dimensions. Briefly, self-aligning techniques render the accuracy of mask positioning out of question in a series of manufacturing steps of a semiconductor device. In other words, the use of self-aligning techniques render it unnecessary to design a semiconductor device bearing in mind the errors unavoidably occurring when positioning masks.

Appended FIGS. 1A and 1B collectively show a method of producing a semiconductor device by employing a conventional self-aligning technique. Referring to FIG. 1A, from a diffusion source such as boron nitride, an impurity such as boron is doped at a high concentration in a silicon substrate 1 with an insulation film such as a silicon oxide film 3 used as a mask, followed by thermal diffusion forming a base region 2 and a silicon oxide film 4. Alternatively, after the oxide film 3 has been formed, the oxide film 4 is formed, followed by doping the substrate with a desired impurity by ion implantation method and a subsequent step of annealing, so as to form the base region 2.

A silicon nitride film 5 is formed on the silicon oxide film 4 and, then, is partly removed by photo etching so as to provide openings 8 and 9. What should be noted is that the remaining portions of the silicon nitride film 5 are used as the mask in the subsequent steps of providing the silicon oxide film 4 with openings 6 and 7. Specifically, the opening 6 communicating with the opening 8 formed in the silicon nitride film 5 is provided first for forming an emitter region 10 within the base region. Upon completion of forming the emitter region 10, the silicon oxide film 4 is provided with the opening 7 communicating with the opening 9 formed in the silicon nitride film 5, followed by forming an emitter electrode and a base electrode extending through the openings, 6, 8 and the other openings 7, 9, respectively. Since the openings 8 and 9 provided in a single step in the silicon nitride film 5 are used for providing the openings 6 and 7 in the silicon oxide film as described above, it is naturally unnecessary to worry about the accuracy of mask positioning.

However, the conventional self-aligning technique described above leaves room for further improvement. Specifically, the silicon oxide film 4 should be at least about 800 Å thick for alleviating the strain at the boundary between the silicon oxide film and the silicon substrate 1, said strain being caused by the silicon nitride film 5 formed on the oxide film 4. Further, oxide film 4 over the base region should desirably be at least about 3,000 Å thick in order to enable the oxide film to exhibit a satisfactory passivation effect and to prevent the surface region of the base from inversion during operation of the semi-conductor device. What should be noted is that it is difficult to provide such a thick oxide film with the openings 6 and 7 at a high precision even if a silicon nitride film is used as the mask. It should also be noted that the oxide film 4 is etched laterally as well as vertically in the step of forming the openings 6 and 7. It follows that the nitride film 5 overhangs the opening formed in the oxide film 4 as shown in FIG. 1B if the oxide film 4 is unduly thick. The overhanging structure tends to cause breakage of the electrode metal formed later in the opening at the stepped portion of the side wall defining the opening. The breakage problem also occurs in the case of using a polycrystalline silicon doped with an impurity for forming the emitter region.

The breakage problem may be solved if, for example, the silicon nitride film is removed after used for providing the openings 6 and 7 in the oxide film. In this case, however, it is necessary to cover the opening 7 with a suitable protection film in the step of forming the emitter region in order to prevent the emitter impurity from being diffused into the base region through the opening 7. Clearly, the advantage of self-aligning technique is impaired.

An object of this invention is to provide a method of producing semiconductor devices by utilizing self-aligning tchnique permitting the insulation film to be made sufficiently thick and to be provided with openings accurately.

According to this invention, there is provided a method of producing semiconductor devices, comprising the steps of:

forming a first insulation film of a relatively high density on a semiconductor substrate of one conductivity type having a first semiconductor region of the opposite conductivity type formed therein in advance, said first semiconductor region being exposed to the surface of the substrate and said first insulation film covering the first semiconductor region;

forming a second insulation film of a relatively low density on the first insulation film;

providing the second insulation film with at least one hole;

densifying the second insulation film to a level substantially equal to that of the first insulation film;

forming a nitride film over the remaining second insulation film and within the hole in the second insulation film;

providing that portion of the nitride film which is located in the hole of the second insulation film with at least one opening selectively exposing the first insulation film;

providing the first insulation film with an opening through the opening in the nitride film so as to expose selectively the surface of the first semiconductor region formed in the substrate; and forming a second semiconductor region of said one conductivity type within the first semiconductor region by utilizing the opening in the first insulation film.

In general, the semiconductor substrate is formed of silicon and the first and second insulation films are composed of silicon oxide. The first insulation film is formed generally by thermal oxidation of the surface region of the silicon substrate. On the other hand, the second insulation film is formed in general by low temperature chemical vapor deposition (CVD). The hole or holes in the second insulation film may or may not expose the surface of the first insulation film, but they usually expose the surface of the first insulation film.

One of the features of this invention resides in that the second insulation film has a lower density, i.e., is etched faster than the first insulation film formed by thermal oxidation. The difference in density between the first and second insulation films is such that the second insulation film is etched 3 to 10 times, preferably 5 to 10 times, as fast as the first insulation film, when brought into contact with a particular etchant used.

In the semiconductor device of this invention, the sum in thickness of the first and second insulation films provides the required thickness of an insulation layer covering the base region.

The nitride film formed on the second insulation film may be left unremoved or may be removed before the final step of producing the semiconductor device. It is preferred to leave the nitride film unremoved because the nitride film produces an excellent passivation effect.

This invention will be more fully understood from the following detailed description when taken in conjunction with the accompanying drawing, in which;

FIGS. 1A and 1B are cross sectional views showing the steps of producing a semiconductor device by utilizing a conventional self-aligning technique;

FIGS. 2A to 2G are cross sectional views showing the steps of producing a semiconductor device according to one embodiment of this invention; and FIGS. 3A to 3I are cross sectional views showing the steps of producing a semiconductor device according to another embodiment of this invention.

Figure 2C:
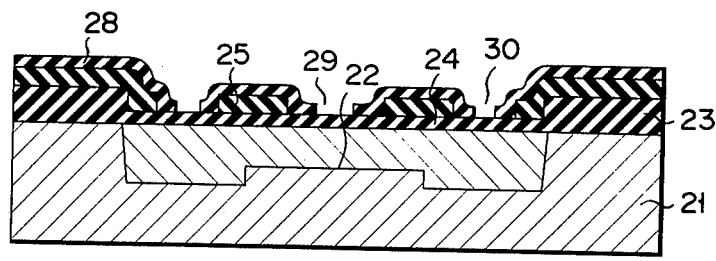

In the embodiment of this invention shown in FIGS. 2A to 2G, the final product of semiconductor device comprises the nitride film used in the manufacturing step thereof. Referring to FIG. 2A, a first silicon oxide film 24 acting as a first insulation film is formed to cover the surface of a guard ring type P-type base region 22 formed in an N-type silicon substrate 21. A first oxide film 24 having a relatively high density and, thus, having a low etching rate, is formed by heat-oxidizing the surface region of the substrate 21 for about 10 minutes at about 1,000° to 1,050° C. under an oxidizing atmosphere. Incidentally, the oxide film 24 is, for example, 1,000 Å thick. In forming the base region 22, a peripheral portion 22b is formed first. Then, a central portion 22a is formed with all the masking film on the base region 22 removed, followed by forming the oxide film 24. It follows that a silicon oxide film 23 at the right and left ends of substrate 21 becomes thicker than the silicon oxide film 24 as shown in the drawing.

A second silicon oxide film 25 having a relatively low density and, thus, having a high etching rate, is formed to cover the oxide films 23 and 24 in a relatively high thickness, for example, in a thickness of about 2,000 Å. In general, low temperature CVD is employed for forming the second oxide film 25. For example, silane introduced together with a carrier gas of argon is heated at about 500° C. under a mixed atmosphere of nitrogen and oxygen so as to form the second silicon oxide film 25.

As shown in FIG. 2B, the second oxide film 25 is selectively removed to provide holes 26 and 27 exposing oxide films 23 and 24 by photo etching with hydrofluoric acid or an aqueous solution of ammonium fluoride used as the etchant. In this etching step, the first silicon oxide film 24 formed by thermal oxidation is scarcely etched because the second oxide film 25 formed by CVD is about 5 times to about 10 times as high in etching rate as the first oxide film 24 when brought into contact with the above-noted etchant. The holes 26 and 27 formed in the second oxide film 25 are positioned at the portions corresponding to an opening 33 (FIG. 2D) and an opening 36 (FIG. 2F) to be formed in the first oxide film 24 in subsequent steps, respectively. These holes 26 and 27 are larger than the openings 33 and 36 which are to be formed later in the first oxide film and it suffices to provide these holes 26 and 27 in a rough pattern.

The remaining second oxide film 25 is densified to a level substantially equal to that of the first silicon oxide film 24 by heating the substrate for 20 minutes at about 900° to 1,000° C. Where the central portion 22a of the base region 22 if formed by ion implantation method, this heat treatment serves the purpose of an annealing step.

Further, a silicon nitride film 28 is formed to cover the remaining second oxide film 25 and the exposed portions of the first oxide film 24 by CVD as shown in FIG. 2C. The nitride film 28 is about 1,000 Å thick and is formed by utilizing, for example, a gaseous phase reaction between silane and ammonia at 850° C., followed by accurately providing openings 29 and 30 in the nitride film 28 simultaneously. It is seen that these openings 29 and 30 are provided in those portions of the nitride film 28 which are in direct contact with the first oxide film 24, namely, in the portions where the holes 26 and 27 were formed in the preceding step in the second oxide film 25. The openings 29 and 30 are smaller than the holes 26 and 27 and the first oxide film 24 is selectively exposed by the provision of the openings 29 and 30. Incidentally, the opening 30 forms a continuous single groove surrounding the opening 29. It should be noted that the opening 29 is positioned at the center of the groove formed by the opening 30. These openings 29 and 30 can be provided without difficulty by plasma etching.

Figure 2D:
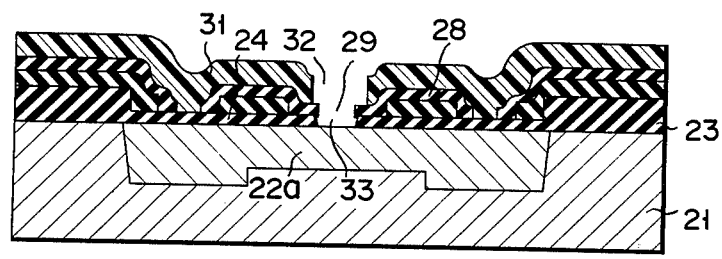

After provision of the openings 29 and 30, a photoresist layer 31 is formed to cover the silicon nitride film 28 and the exposed portions of the first oxide film 24 as shown in FIG. 2D. Then, an opening 32 is formed in the photoresist layer 31 in a manner to expose the edge portion of the nitride film 28 defining the opening 29 formed in the preceding step. Naturally, the first oxide film 24 is also exposed partly by the provision of the opening 32. The exposed portion of the nitride film 28 is used as the mask in the following step. Namely, the exposed portion of the first oxide film 24 is etched to provide the opening 33 mentioned previously by using the above-noted mask so as to expose partly the central portion 22a of the base region 22. The opening 33 thus provided is used for forming an emitter region 34 in the base region 22. The first oxide film 24 is etched laterally as well as vertically in the step of providing the opening 33, resulting in an overhanging structure of the nitride film 28. But, the oxide film 24 is so thin that the lateral etch is as small as at most about 0.2 μ. The lateral etch of this order does not give rise to the breakage problem of a polycrystalline silicon layer or electrode metal layer which is formed later in the free space above the emitter region 34. That is, substantially no overhanging structure is created.

Figure 2E:
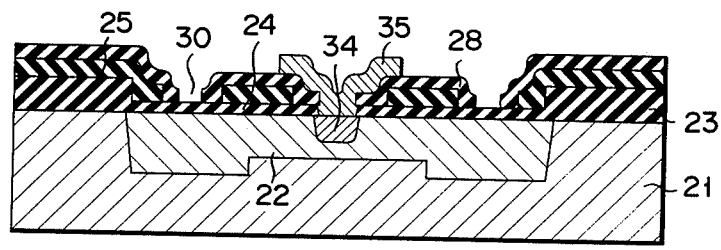
Figure 2F:
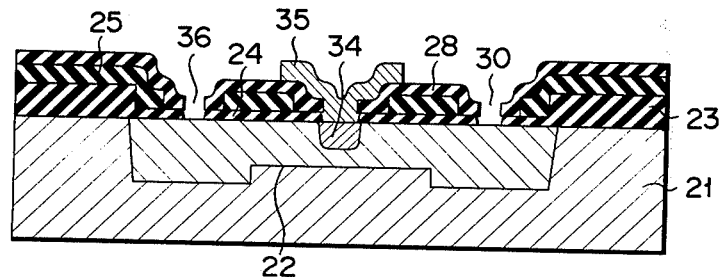

As mentioned above, the opening 33 formed in the first oxide film 24 is used for forming the emitter region 34 doped with an N-type impurity. Specifically, a polycrystalline silicon layer 35 doped with an N-type impurity is formed by CVD to cover the opening 33 as shown in FIG. 2F, followed by heating so as to diffuse the N-type impurity into the emitter region 34. Alternatively, it is possible to employ the ordinary diffusion method or an ion implantation method for forming the emitter region 34 doped with an N-type impurity.

After the emitter region 34 has been formed, the first oxide film 24 is provided with an opening 36 exposing partly the base region 22 as shown in FIG. 2F. It is seen that the opening 36 communicates with the opening 30 formed in the nitride film 28. Of course, the nitride film 28 is used as the mask in providing the first oxide film 24 with the opening 36. For the case of using the polycrystalline silicon layer 35 in forming the emitter region 34 as shown in FIG. 2E, the photoresist layer 31 need not be retained in the step of providing the opening 36 in the first oxide film 24, because neither the polycrystalline silicon layer 35 nor the silicon nitride film 28 is etched by ammonium fluoride or hydrofluoric acid used as the etchant of the first silicon oxide layer 24. Where the emitter region 34 is exposed as in the case of employing ion implantation for forming the emitter region 34, the opening 36 is formed by the steps followed in providing the opening 33 in the first oxide film 24. An overhanging structure of the nitride film 28 is also caused by the lateral etch of the first oxide film 24 in the step of providing the opening 36. However, the overhanging structure does not give rise to any substantial inconvenience as described previously. Thus, for the purpose of this invention there is substantially no overhanging structure.

Figure 2G:
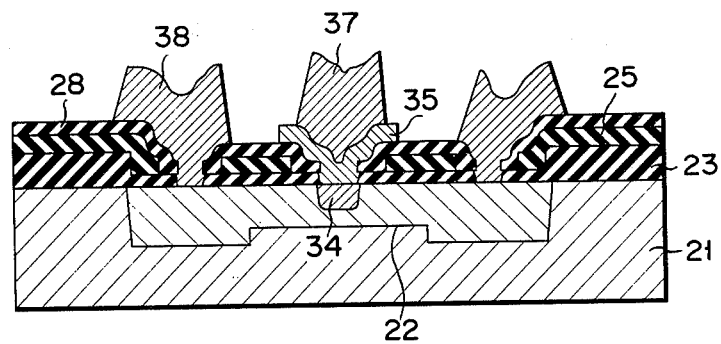

Finally, an emitter electrode 37 and a base electrode 38 are mounted as shown in FIG. 2G so as to produce a bipolar transistor for high frequencies. It is seen that the polycrystalline silicon layer 35 is used as a part of the emitter electrode.

As described in detail, the method of this invention comprises forming a second silicon oxide film by CVD on a first silicon oxide film, rendering it possible to form a sufficiently thick insulation layer on the base region without decreasing the locational accuracy of the openings formed in the first silicon oxide film, said openings serving to expose partly the emitter region and the base region, respectively. Further, the method of this invention permits eliminating the breakage problem of the electrode metal. Thus, it is possible to leave unremoved the silicon nitride film exhibiting an excellent passivation effect resulting in a semiconductor device which exhibits excellent properties. Still further, an opening exposing partly the base region is not formed in the first silicon oxide film in the step of forming the emitter region. Thus, the base region is not doped with an undesired impurity.

FIGS. 3A to 3I collectively show a method of producing a semiconductor device according to another embodiment of this invention. In this case, the produced semiconductor device does not comprise the silicon nitride film used in the manufacturing step thereof.

Figure 3A:
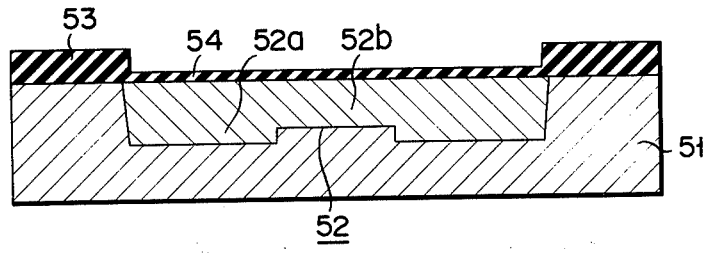

FIG. 3A is just the same as FIG. 2A. Namely, a P-type base region 52 of guard ring type corresponding to the base region 22 of FIG. 2A is formed in an N-type silicon substrate 51 corresponding to the substrate 21 of FIG. 2A. Furhter, a first slilicon oxide film 54 and another silicon oxide film 53 shown in FIG. 3A correspond to the oxide films 24 and 23 of FIG. 2A, respectively.

Figure 3B:
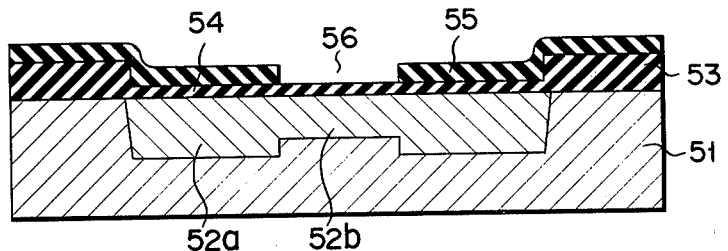

A second silicon oxide film 55 is formed by CVD on the first oxide film 54 as is the case with the second oxide film 25 shown in FIG. 2B, followed by providing the second oxide film 55 with a hole 56 by photo etching with hydrofluoric acid or an aqueous solution of ammonium fluoride used as the etchant (see FIG. 3B). As shown in the drawing, the hole 56 serves to expose partly the first oxide film 54. The hole 56 should be larger than an opening formed later in the exposed portion of the first oxide film 54, but it suffices to provide the hole 56 at a rough patterning. The substrate is then heated for 20 minutes at about 900° to 1,000° C. so as to densify the remaining second film 55 to a level substantially equal to that of the first oxide film 54. By this heat treatment, the first and second oxide films are converted into a single insulation layer of substantially uniform properties.

Figure 3C:
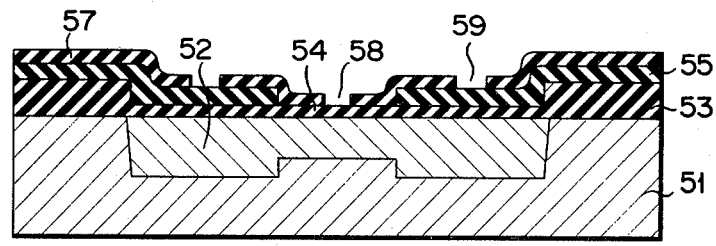

A silicon nitride film 57 about 1,000 Å thick is formed to cover the remaining second oxide film 55 and the exposed portion of the first oxide film 54 by utilizing gaseous phase reaction at 850° C. between silane and ammonia, followed by providing openings 58 and 59 in the nitride film 57 as shown in FIG. 3C. These openings 58 and 59 partly exposing the first and second oxide films 54 and 55, respectively, should be formed accurately in a single step. The opening 58 should be positioned at the center of the single continuous groove formed by the opening 59 as is the case with the embodiment of FIGS. 2A to 2G. These openings 58 and 59 can be provided without difficulty by plasma etching.

Figure 3D:
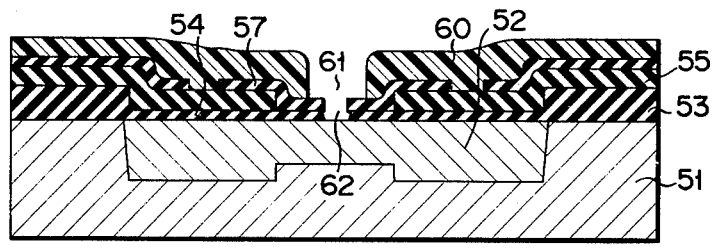

FIG. 3D shows that a photoresist layer 60 formed in the succeeding step is provided with an opening 61 of rough patterning. It is seen that the opening 61 exposes the edge portion of the nitride film 57 defining the opening 58. The exposed portion of the nitride film 57 is used as the mask for providing the first silicon oxide film 54 with an opening 62 partly exposing the base region 52.

Figure 3E:
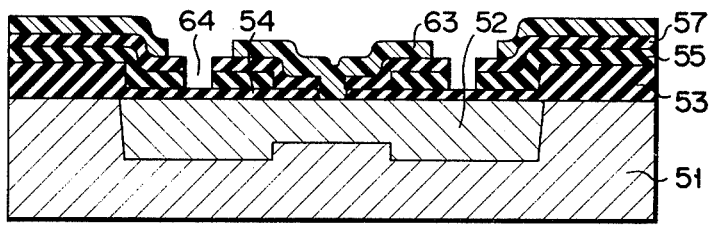
Figure 3F:
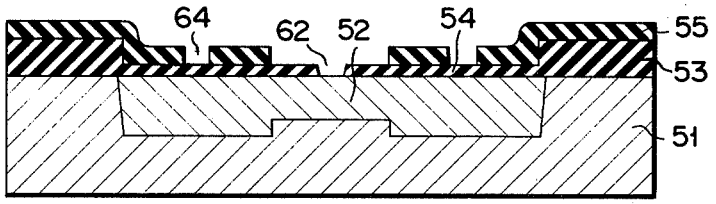

After provision of the opening 62 in the first oxide film 54, the photoresist layer 60 is removed, followed by newly forming another photoresist layer 63 as shown in FIG. 3E. Then, the photoresist layer 63 is selectively removed at rough patterning to expose the edge portion of the nitride film 57 defining the opening 59 formed previously in the nitride film. The exposed portion of the nitride film 57 is used as the mask for providing the second oxide film 55 with a hole 64 about 1,500 to 2,000 Å deep, thereby partly exposing the first oxide film 54. In the next step, the remaining photoresist layer 63 and silicon nitride film 57 are removed as shown in FIG. 3F.

A polycrystalline silicon layer 65 doped with an N-type impurity, which is shown in FIG. 3G, is formed by CVD at 650° C. It is seen that the polycryptalline silicon layer 65 has been removed except for the portion covering the opening 62 formed in the first oxide film 54. An emitter region 66 is formed in the base region 52 by thermally diffusing into part of the base region the N-type impurity contained in the polycryptalline silicon layer 65. At this time, the impurity does not diffuse through the hole 64 into the base region 52 since the hole 64 does not reach the surface of the base region. After formation of the emitter region 66, a photoresist layer 67 is formed, followed by providing the photoresist layer 67 with an opening communicating with and larger than the hole 64 formed previously in the second oxide film 55 as shown in FIG. 3H. Then, the first oxide film 54 is selectively etched to expose partly the base region 52 through the opening formed in the photoresist layer 67. It is seen that an opening 68, in which is formed later a base electrode, is formed by this etching step. Finally, the remaining photoresist layer 67 is removed, followed by mounting an emitter electrode 69 and a base electrode 70 as shown in FIG. 3I. It is seen that the emitter electrode 69 is formed on the polycrystalline silicon layer 65 which is left unremoved. It should be noted that an accurate patterning is not required in providing the photoresist layer 67 with the opening exposing the second oxide film 55 around the hole 64.

As described in detail, the embodiment of this invention shown in FIGS. 3A to 3I also comprises forming by CVD a second silicon oxide film on a silicon oxide film formed by thermal oxidation of a silicon substrate. This renders it possible to form a sufficiently thick insulation layer on the base region without decreasing the locational accuracy of an opening formed in the first silicon oxide film for forming an emitter region. What should also be noted is that the second silicon oxide film is provided accurately with a hole by using a silicon nitride film as the mask. Thus, the removal of the silicon nitride film in the subsequent step does not give any detrimental effect to the self-aligning capability. Further, the method of this invention relating to FIGS. 3A to 3I permits eliminating the breakage problem of the polycrystalline silicon layer and the electrode metal layer because the silicon nitride layer is removed in advance. Still further, the base region is not doped with the emitter impurity at the step of forming the emitter region as described above.

What is claimed is:

1. A method of producing semiconductor devices, comprising the steps of:
    forming a first insulation film on a semiconductor substrate of one conductivity type having a first semiconductor region of the opposite conductivity type formed therein in advance, said first semiconductor region being exposed to the surface of the substrate and said first insulation film covering the first semiconductor region;
    forming a second insulation film on the first insulation film, said second insulation film having a property which permits it to be etched 3 to 10 times as fast as said first insulation film;
    providing the second insulation film with at least one hole;
    converting said second insulation film to have a property which permits it to be etched at substantially the same rate as said first insulation film;
    forming a nitride film over the remaining second insulation film and within the hole in the second insulation film;
    providing that portion of the nitride film which is located in the hole of the second insulation film with at least one opening selectively exposing the first insulation film;
    providing the first insulation film with an opening through the opening in the nitride film so as to expose selectively the surface of the first semiconductor region formed in the substrate; and
    forming a second semiconductor region of said one conductivity type within the first semiconductor region by utilizing the opening in the first insulation film.

2. The method according to claim 1, which further comprises the step of removing the nitride film immediately before forming the second semiconductor region.

3. The method according to claim 1 or 2, wherein the semiconductor substrate is formed of silicon.

4. The method according to claim 3, wherein the first insulation film is formed by thermally oxidizing the surface region of the semiconductor substrate.

5. The method according to claim 4, wherein the second insulation film is formed by low temperature chemical vapor deposition.

6. The method according to claim 5, wherein the second insulation film is converted to permit it to be etched at substantially the same rate as said first insulation film by heat treatment.

7. A method of producing semiconductor devices, comprising the steps of:
    forming a first insulation film on a semiconductor substrate of one conductivity type having a first semiconductor region of the opposite conductivity type formed therein in advance, said first semiconductor region being exposed to the surface of the substrate and said first insulation film covering the first semiconductor region;
    forming a second insulation film on the first insulation film, said second insulation film having a property which permits it to be etched 3 to 10 times as fast as said first insulation film;
    providing the second insulation film with first and second holes to expose selectively the surface of the first insulation film;
    converting said second insulation film to have a property which permits it to be etched at substantially the same rate as said first insulation film;
    forming a nitride film to cover the remaining second insulation film and the exposed portions of the first insulation film;
    providing those portions of the nitride film which are located in the first and second holes of the second insulation film with first and second openings selectively exposing the first insulation film, the openings formed in the nitride film being smaller than the holes formed previously in the second insulation film;
    providing the first insulation film with an opening by utilizing the first opening of the nitride film so as to expose selectively the surface of the first semiconductor region formed in the substrate;
    forming a second semiconductor region of said one conductivity type within the first semiconductor region by utilizing the opening of the first insulation film communicating with the first opening of the nitride film; and
    providing the first insulation film with an opening selectively exposing the first semiconductor region by utilizing the second opening of the nitride film, the electrode of the first semiconductor region being mounted later in the free space provided by the opening formed in the first insulation film and communicating with the second opening formed in the nitride film.

8. The method according to claim 7, wherein the semiconductor substrate is formed of silicon.

9. The method according to claim 8, wherein the first insulation film is formed by theremally oxidizing the surface region of the semiconductor substrate.

10. The method according to claim 9, wherein the second insulation film is formed by low temperature chemical vapor deposition.

11. The method according to claim 10, wherein the second insulation film is converted to permit it to be etched at substantially the same rate as said first insulation film by heat treatment.

12. The method according to claim 11, wherein the first semiconductor region is a base region and the second semiconductor region is an emitter region.

13. A method of producing semiconductor devices, comprising the steps of:

forming a first insulation film on a semiconductor substrate of one conductivity type having a first semiconductor region of the opposite conductivity type formed therein in advance, said first semiconductor region being exposed to the surface of the substrate and said first insulation film covering the first semiconductor region;

forming a second insulation film on the first insulation film, said second insulation film having a property which permits it to be etched 3 to 10 times as fast as said first insulation film;

providing the second insulation film with a relatively large hole partly exposing the first insulation film;

converting said second insulation film to have a property which permits it to be etched at substantially the same rate as said first insulation film;

forming a nitride film covering the remaining second insulation film and the exposed portion of the first insulation film;

simultaneously providing the nitride film with a first opening partly exposing the first insulation film and a second opening partly exposing the second insulation film;

providing the first insulation film with an opening partly exposing the first semiconductor region by utilizing the first opening of the nitride film;

providing the second insulation film with a hole partly exposing the first insulation film by utilizing the second opening of the nitride film;

removing all the remaining nitride film;

forming a second semiconductor region of said one conductivity type within the first semiconductor region by utilizing the opening of the first insulation film;

and providing the first insulation film with an opening partly exposing the first semiconductor region by utilizing the opening of the second insulation film formed previously by utilizing the second opening of the nitride film, the electrode of the first semiconductor region being mounted later in the free space provided by the opening extending through the first and second insulation films.

* * * * *